(12) United States Patent
Uhle et al.

(10) Patent No.: US 8,812,308 B2
(45) Date of Patent: Aug. 19, 2014

(54) APPARATUS AND METHOD FOR MODIFYING AN INPUT AUDIO SIGNAL

(71) Applicant: Fraunhofer-Gesellschaft zur Foerderung der angewandten Forschung e.V., Munich (DE)

(72) Inventors: Christian Uhle, Nuremberg (DE); Juergen Herre, Buckenhof (DE); Oliver Hellmuth, Erlangen (DE); Stefan Finauer, Erlangen (DE)

(73) Assignee: Fraunhofer-Gesellschaft zur Foerderung der angewandten Forschung e.V., Munich (DE)

( * ) Notice: Subject to any disclaimer, the term of this patent is extended or adjusted under 35 U.S.C. 154(b) by 0 days.

(21) Appl. No.: 13/654,790

(22) Filed: Oct. 18, 2012

(65) Prior Publication Data

US 2013/0046546 A1 Feb. 21, 2013

Related U.S. Application Data

(63) Continuation of application No. PCT/EP2011/056355, filed on Apr. 20, 2011.

(30) Foreign Application Priority Data

Apr. 22, 2010 (EP) ..................... 10160679

(51) Int. Cl.
*G10L 19/08* (2013.01)

(52) U.S. Cl.
USPC ........................................ 704/223

(58) Field of Classification Search
USPC ................ 704/201.1, 219–230, 500–504
See application file for complete search history.

(56) References Cited

U.S. PATENT DOCUMENTS

| 4,641,361 A | 2/1987 | Rosback |
| 5,255,323 A | 10/1993 | Ishihara et al. |

(Continued)

FOREIGN PATENT DOCUMENTS

| JP | 03-296312 A | 12/1991 |
| JP | 05-206772 A | 8/1993 |

(Continued)

OTHER PUBLICATIONS

Stevens, "Calculation of the Loudness of Complex Noise," Journal of the Acoustical Society of America, vol. 28, No. 5, Sep. 1956, pp. 807-832.

(Continued)

*Primary Examiner* — Abul Azad
(74) *Attorney, Agent, or Firm* — Keating & Bennett, LLP

(57) ABSTRACT

An apparatus for modifying an input audio signal has an excitation determiner, a storage device and a signal modifier. The excitation determiner determines a value of an excitation parameter of a subband of a plurality of subbands of the input audio signal based on an energy content of the subband. Further, the storage device stores a lookup table containing a plurality of spectral weighting factors. A spectral weighting factor of the plurality of spectral weighting factors is associated to a predefined value of the excitation parameter and a subband of the plurality of subbands. The storage device provides a spectral weighting factor corresponding to the determined value of the excitation parameter and corresponding to the subband, the value of the excitation parameter is determined for. Further, the signal modifier modifies a content of the subband of the audio signal, the value of the excitation parameter is determined for, based on the provided spectral weighting factor to provide a modified subband.

21 Claims, 5 Drawing Sheets

(56) References Cited

U.S. PATENT DOCUMENTS

| | | | |
|---|---|---|---|
| 6,029,126 A * | 2/2000 | Malvar | 704/204 |
| 6,041,297 A * | 3/2000 | Goldberg | 704/219 |
| 6,351,529 B1 | 2/2002 | Holeva | |
| 2009/0097676 A1 | 4/2009 | Seefeldt | |

FOREIGN PATENT DOCUMENTS

| | | |
|---|---|---|
| JP | 06-177688 A | 6/1994 |
| JP | 07-122953 A | 5/1995 |
| JP | 07-307632 A | 11/1995 |
| JP | 11-166835 A | 6/1999 |
| JP | 11-298990 A | 10/1999 |
| JP | 3119677 B2 | 12/2000 |
| JP | 2001-024459 A | 1/2001 |
| JP | 2008-294953 A | 12/2008 |
| JP | 2009-532739 A | 9/2009 |
| WO | 2007/120453 A1 | 10/2007 |

OTHER PUBLICATIONS

Zwicker, "Psychological and Methodical Basis of Loudness," Acoustica 1958, pp. 237-258.

Moore et al., "A Model for the Prediction of Thresholds, Loudness, and Partial Loudness," J. Audio Eng. Soc., vol. 45, No. 4, Apr. 1997, pp. 224-240.

Allen, "A Short History of Telephone Psychophysics," 103rd Audio Eng. Soc. Convention, Sep. 26-29, 1997, 37 pages.

Zwicker et al., "Program for Calculating Loudness According to DIN 45631 (ISO 532B)," J. Acoust. Soc. Jpn. (E), vol. 12, No. 1, 1991, pp. 39-42.

Watson et al., "Signal Duration and Signal Frequency in Relation to Auditory Sensitivity," The Journal of the Acoustical Society of America, vol. 46, No. 4 (Part 2), Jun. 25, 1969, pp. 989-997.

Official Communication issued in corresponding European Patent Application No. 10 160 679.6, mailed on Nov. 21, 2012.

Official Communication issued in corresponding Japanese Patent Application No. 2013-505480, mailed on Feb. 18, 2014.

* cited by examiner

APPARATUS AND METHOD FOR MODIFYING AN INPUT AUDIO SIGNAL

CROSS-REFERENCE TO RELATED APPLICATIONS

This application is a continuation of copending International Application No. PCT/EP2011/056355, filed Apr. 20, 2011, which is incorporated herein by reference in its entirety, and additionally claims priority from European Applications No. EP 10160679.6, filed Apr. 22, 2010, which is also incorporated herein by reference in its entirety.

BACKGROUND OF THE INVENTION

Embodiments according to the invention relate to audio signal processing and particularly to an apparatus and method for modifying an input audio signal.

There have been many attempts to develop a satisfactory objective method of measuring loudness. Fletcher and Munson determined in 1933 that human hearing is less sensitive at low and high frequencies than at middle (or voice) frequencies. They also found that the relative change in sensitivity decreased as the level of the sound increased. An early loudness meter consisted of a microphone, amplifier, meter and a combination of filters designed to roughly mimic the frequency response of hearing at low, medium and high sound levels.

Even though such devices provided a measurement of the loudness of a single, constant level, isolated tone, measurements of more complex sounds did not match the subjective impressions of loudness very well. Sound level meters of this type have been standardized but are only used for specific tasks, such as the monitoring and control of industrial noise.

In the early 1950s, Zwicker and Stevens, among others, extended the work of Fletcher and Munson in developing a more realistic model of the loudness perception process. Stevens published a method for the "Calculation of the Loudness of Complex Noise" in the Journal of the Acoustical Society of America in 1956, and Zwicker published his "Psychological and Methodical Basis of Loudness" article in Acoustica in 1958. In 1959 Zwicker published a graphical procedure for loudness calculation, as well as several similar articles shortly after. The Stevens and Zwicker methods were standardized as ISO 532, parts A and B (respectively). Both methods involve similar steps.

First, the time-varying distribution of energy along the basilar membrane of the inner ear, referred to as the excitation, is simulated by passing the audio through a bank of band-pass auditory filters with center frequencies spaced uniformly on a critical band rate scale. Each auditory filter is designed to simulate the frequency response at a particular location along the basilar membrane of the inner ear, with the filter's center frequency corresponding to this location. A critical-band width is defined as the bandwidth of one such filter. Measured in units of Hertz, the critical-band width of these auditory filters increases with increasing center frequency. It is therefore useful to define a warped frequency scale such that the critical-band width for all auditory filters measured in this warped scale is constant. Such a warped scale is referred to as the critical band rate scale and is very useful in understanding and simulating a wide range of psychoacoustic phenomena. See, for example, *Psychoacoustics-Facts and Models* by E. Zwicker and H. Fastl, Springer-Verlag, Berlin, 1990. The methods of Stevens and Zwicker utilize a critical band rate scale referred to as the Bark scale, in which the critical-band width is constant below 500 Hz and increases above 500 Hz. More recently, Moore and Glasberg defined a critical band rate scale, which they named the Equivalent Rectangular Bandwidth (ERB) scale (B. C. J. Moore, B. Glasberg, T. Baer, "A Model for the Prediction of Thresholds, Loudness, and Partial Loudness," *Journal of the Audio Engineering Society*, Vol. 45, No. 4, April 1997, pp. 224-240). Through psychoacoustic experiments using notched-noise maskers, Moore and Glasberg demonstrated that the critical-band width continues to decrease below 500 Hz, in contrast to the Bark scale where the critical-band width remains constant.

The term "critical band" goes back to the work by Harvey Fletcher in 1938 on masking of sound sensation by accompanying signals ("J. B. Allen, "A short history of telephone psychophysics", Audio Eng. Soc. Convention, 1997"). Critical bands can be expressed using the Bark scale proposed by Zwicker in 1961: each critical band has the width of one Bark (a unit named after the Heinrich Barkhausen). Over filter banks mimicking the human auditory perception exist, e.g., the Equivalent Rectangular Bandwidth (ERB) scale ("B. C. J. Moore, B. R. Glasberg and T. Baer, "A model for the prediction of thresholds, loudness, and partial loudness", J. Audio Eng. Soc., 1997").

The term "specific loudness" describes the sensation of loudness caused by a signal on a certain region of the basilar membrane to a certain frequency bandwidth measured in critical bands. It is measured in units of Sone/Bark. The term "critical band" relates to the frequency bands of an auditory filter bank which comprises non-uniform band-pass filter banks designed to imitate the frequency resolution of human hearing. The overall loudness of a sound equals the sum/integral of the specific loudness across all critical bands.

A method for processing an audio signal has been described in "A. J. Seefeldt, "Calculating and adjusting the perceived loudness and/or the perceived spectral balance of an audio signal". US Patent 2009/0097676, 2009". This method aims at the control of the specific loudness of the audio signal, with applications to volume control, dynamic range control, dynamic equalization and background noise compensation. In this document an input audio signal (normally in the frequency domain) is modified such that its specific loudness matches a target specific loudness.

To illustrate the advantage of the processing as presented in "A. J. Seefeldt, "Calculating and adjusting the perceived loudness and/or the perceived spectral balance of an audio signal". US Patent 2009/0097676, 2009", consider the volume control of an audio signal. Changing the level of an audio signal in sound reproduction normally aims at the change of its perceived loudness. Said differently, the control of the loudness is traditionally implemented as the control of the sound level. However, our daily experience and the knowledge of psychoacoustic indicate that this is not optimal.

The sensitivity of the human hearing varies with both frequency and level such that a decrease of the sound intensity level attenuates the sensation of low and high frequencies (e.g., around 100 Hz and 10000 Hz, respectively) more than the sensation of middle frequencies (e.g., between 2000 and 4000 Hz). When decreasing the playback level from a "comfortably loud" level (e.g., 75-80 dBA) to a lower level by e.g., 18 dB, the perceived spectral balance of the audio signal changes. This is illustrated in the well-known Equal-Loudness Contours, often referred to as Fletcher-Munson Curves (after the researchers who first measured the Equal-Loudness Contours in 1933). The Equal-Loudness Contour shows the sound pressure level (SPL) over the frequency spectrum, for which a listener perceives a constant loudness when presented with pure steady tones.

Equal-Loudness Contours are depicted in e.g. "B. C. J. Moore, B. R. Glasberg and T. Baer, "A model for the prediction of thresholds, loudness, and partial loudness", J. Audio Eng. Soc., 1997), p. 232, FIG. 13". A revised measurement has been standardized as ISO 226:2003 in 2003.

Consequently, the conventional loudness control does not only change the loudness but also the timbre. The impact of this effect depends on the SPL (it is less pronounced when changing the SPL from e.g., 86 dBA to 68 dBA compared to a change from 76 dBA to 58 dBA), but is not desired in all classes.

This is compensated by the processing as described in "A. J. Seefeldt, "Calculating and adjusting the perceived loudness and/or the perceived spectral balance of an audio signal". US Patent 2009/0097676, 2009".

FIG. 7 shows a flow chart of a method 700 described in "A. J. Seefeldt, "Calculating and adjusting the perceived loudness and/or the perceived spectral balance of an audio signal". US Patent 2009/0097676, 2009".

The output signal is processed by calculating 710 the excitation signal, calculating 720 the specific loudness, calculating 730 the target specific loudness, calculating 740 the target excitation signal, calculating 750 the spectral weights and applying 760 spectral weights to the input signal and resynthesizing the output signal.

The spectral weights H are weightings of the frequency bands which depend on the specific loudness of the input signal and on the target specific loudness. Their calculation, as described in "A. J. Seefeldt, "Calculating and adjusting the perceived loudness and/or the perceived spectral balance of an audio signal". US Patent 2009/0097676, 2009)", comprises the calculation of the specific loudness and the inverse process of the calculation of the specific loudness, which is applied to the target specific loudness.

Both processing steps introduce a high computational load. Methods for the calculation of the specific loudness have been presented in "E. Zwicker, H. Fastl, U. Widmann, K. Kurakata, S. Kuwano and S. Namba, "Program for calculating loudness according to DIN 45631 (ISO 532 B)", J. Acoust. Soc. Jpn. (E), vol. 12, 1991" and "B. C. J. Moore, B. R. Glasberg and T. Baer, "A model for the prediction of thresholds, loudness, and partial loudness", J. Audio Eng. Soc., 1997".

SUMMARY

According to an embodiment, an apparatus for modifying an input audio signal may have an excitation determiner configured to determine a value of an excitation parameter of a subband of a plurality of subbands of the input audio signal based on an energy content of the subband, wherein the value of the excitation parameter indicates a power of the audio signal in the subband or a short time energy of the audio signal in the subband or a quantized value of the short time energy of the audio signal in the subband; a storage device storing a lookup table comprising a plurality of spectral weighting factors, wherein a spectral weighting factor of the plurality of spectral weighting factors is associated to a predefined value of the excitation parameter and a subband of the plurality of subbands, wherein the storage device is configured to provide a spectral weighting factor corresponding to the determined value of the excitation parameter and corresponding to the subband, the value of the excitation parameter is determined for; and a signal modifier configured to modify a content of the subband of the input audio signal, the value of the excitation parameter is determined for, based on the provided spectral weighting factor to provide a modified subband by multiplicative scaling of the subband of the audio signal by the spectral weighting factor provided by the lookup table.

According to another embodiment, a method for modifying an input audio signal may have the steps of determining a value of an excitation parameter of a subband of a plurality of subbands of the input audio signal based on an energy content of the subband, wherein the value of the excitation parameter indicates a power of the audio signal in the subband or a short time energy of the audio signal in the subband or a quantized value of the short time energy of the audio signal in the subband; providing a spectral weighting factor corresponding to the determined value of the excitation parameter and corresponding to the subband, the value of the excitation parameter is determined for, wherein the spectral weighting factor is stored in a lookup table comprising a plurality of spectral weighting factors, wherein a spectral weighting factor of the plurality of spectral weighting factors is associated to a predefined value of the excitation parameter and a subband of the plurality of subbands; modifying the subband, the value of the excitation parameter is determined for, based on the provided spectral weighting factor to provide a modified subband by multiplicative scaling of the subband of the audio signal by the spectral weighting factor provided by the lookup table.

An embodiment of the invention provides an apparatus for modifying an input audio signal comprising an excitation determiner, a storage device and a signal modifier. The excitation determiner is configured to determine a value of an excitation parameter of a subband of a plurality of subbands of the input audio signal based on an energy content of the subband signal. The storage device is configured to store a lookup table containing a plurality of spectral weighting factors, wherein a spectral weighting factor of the plurality of spectral weighting factors is associated to a predefined value of the excitation parameter and a subband of the plurality of subbands. Further, the storage device is configured to provide a spectral weighting factor corresponding to the determined value of the excitation parameter and corresponding to the subband, the value of the excitation parameter is determined for. The signal modifier is configured to modify a content of the subband of the input audio signal, the excitation parameter is determined for, based on the provided spectral weighting factor to provide a modified subband.

Embodiments according to the present invention are based on the central idea that subbands of an audio signal can be modified easily by using a lookup table containing spectral weighting factors, which may be chosen depending on the respective subband and excitation parameter of the subband. For this, the lookup table contains spectral weighting factors for a plurality of predefined values of the excitation parameter for at least one predefined subband of the plurality of subbands. By using the lookup table, the computational complexity can be significantly reduced, since an explicit calculation of the spectral weighting factors (which includes the calculation of the loudness, its modification and the inverse processing of the loudness computation) is not necessary. Therefore, an efficient implementation is enabled.

In some embodiments according to the invention, the excitation determiner determines a value of an excitation parameter not for all subbands of the plurality of subbands. Further, the lookup table contains only spectral weighting factors associated to subbands, a value of an excitation parameter is determined for. In this way, the needed storage space of the lookup table and the computational effort for the excitation determiner may be reduced.

Some embodiments according to the invention relate to a lookup table comprising exactly three dimensions associated to predefined values of the excitation parameter, to subbands of the plurality of subbands and to predefined values of an external modification parameter.

Some further embodiments according to the invention relate to a lookup table comprising exactly four dimensions associated to predefined values of the excitation parameter, to subbands of the plurality of subbands, to predefined values of the external modification parameter and to predefined values of a background noise parameter.

BRIEF DESCRIPTION OF THE DRAWINGS

Embodiments according to the invention will be detailed subsequently referring to the appended drawings, in which.

DETAILED DESCRIPTION OF THE INVENTION

Figure 1:
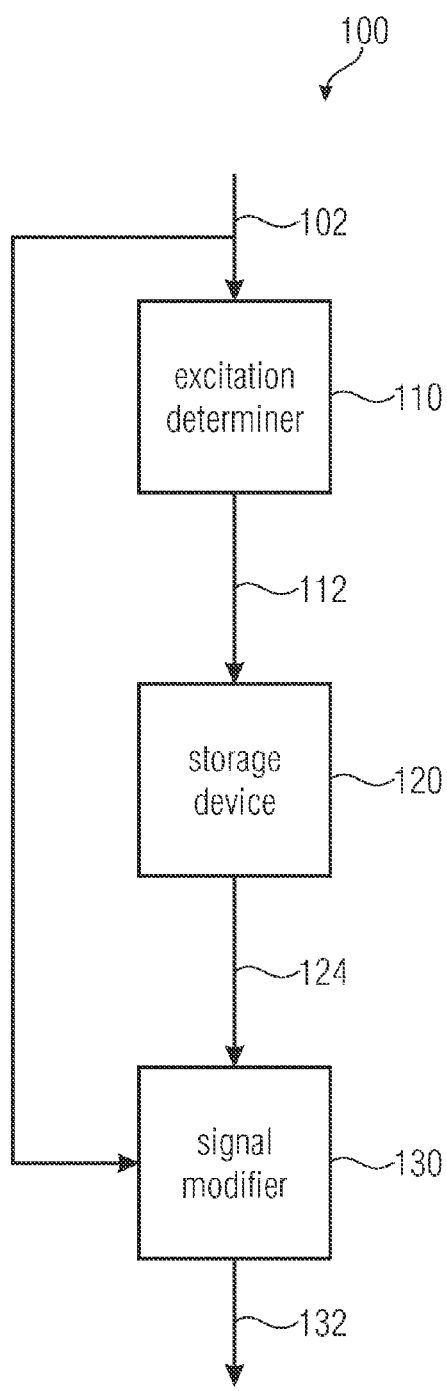
FIG. 1 is a block diagram of an apparatus for modifying an input audio signal.

In the following, the same reference numerals are partly used for objects and functional units having the same or similar functional properties and the description thereof with regard to a figure shall apply also to other figures in order to reduce redundancy in the description of the embodiments.

FIG. 1 shows a block diagram of an apparatus 100 for modifying an input audio subband signal 102 according to an embodiment of the invention. The apparatus 100 comprises an excitation determiner 110, a storage device 120 and a signal modifier 130. The excitation determiner 110 is connected to the storage device 120 and the storage device 120 is connected to the signal modifier 130. The excitation determiner 110 determines a value 112 of an excitation parameter of a subband 102 of a plurality of subbands of the input audio signal 102 based on an energy content of the subband 102. The storage device 120 stores a lookup table containing a plurality of spectral weighting factors, wherein a spectral weighting factor 124 of the plurality of spectral weighting factors is associated to a predefined value of the excitation parameter and a subband of the plurality of subbands. Further, the storage device 120 provides a spectral weighting factor 124 corresponding to the determined value 112 of the excitation parameter and corresponding to the subband 102, the value 112 of the excitation parameter is determined for. The signal modifier 130 modifies a content of the subband 102 of the input audio signal, the value 112 of the excitation parameter is determined for, based on the provided spectral weighting factor 124 to obtain and provide a modified subband 132.

By using a lookup table for providing spectral weighting factors 124 for modifying the input audio signal, the computational complexity can be significantly reduced compared to known concepts.

The excitation determiner 110 determines a value 112 of an excitation parameter based on an energy content of the subband 102. This may be done, for example, by measuring the energy content of a subband 102 to determine the value 112 of the excitation parameter for the subband 102. In this way, an excitation parameter may represent a measure for a power per subband or a short time energy in a specific subband, since the energy content may vary in time and/or between different subbands. Alternatively, the value of the excitation parameter may be determined based on a (unique, injective, bijective) function of the short time energy of a subband (e.g. a exponential function, a logarithmic function or a linear function). For example, a quantization function may be used. In this example, the excitation determiner 110 may measure an energy content of the subband and may quantize the measured energy content of the subband to obtain the value of the excitation parameter, so that the value of the excitation parameter is equal to a predefined value of the excitation parameter. In other words, a measured energy value may be assigned to a predefined value of the excitation parameter (e.g. the closest predefined value of the excitation parameter). Alternatively, the value of the excitation parameter indicates directly the measured energy content and the storage device 120 may assign the determined value of the excitation parameter to a predefined value of the excitation parameter.

The subbands of the input audio signal may represent different frequency bands of the input audio signal. For taking into account a perceptual distribution of the frequency bands, the subbands may be distributed, for example, according to the ERB scale or the Bark scale or another frequency spacing which imitates the frequency resolution of the human ear. In other words, the subbands of the plurality of subbands of the input audio signal may be divided up according to the ERB scale or the Bark scale.

The storage device 120 comprises an input for the excitation parameter (excitation signal) and for a subband index indicating the subband 102, the value 112 of the excitation parameter is determined for. Alternatively, the storage device comprises one or more further inputs for further parameters.

The storage device 120 may be a digital storage medium as, for example, a read only memory (ROM), a hard disk, a CD, a DVD or any other kind of non-volatile memory, or a random access memory (RAM).

The lookup table represents at least a two-dimensional matrix containing the plurality of spectral weighting factors. A spectral weighting factor 124 contained by the lookup table is unambiguously associated to a predefined value of the excitation parameter and a subband of the plurality of subbands. In other words, each spectral weighting factor contained by the lookup table may be associated to a predefined value of the excitation parameter and a subband of the plurality of subbands. The storage device 120 may provide a spectral weighting factor 124 associated to a predefined value of the excitation parameter closest to the determined value 112 of the excitation parameter. Alternatively, for example, the storage device 120 may linearly or logarithmically interpolate the two spectral weighting factors associated to the two predefined values of the excitation parameter closest to the determined value 112 of the excitation parameter.

The predefined values of the excitation parameter may be linearly or logarithmically distributed.

The signal modifier 130 may, for example, amplify or attenuate the content of the subband 102, the value 112 of the excitation parameter is determined for, by the provided spectral weighting factor 124.

Figure 2:
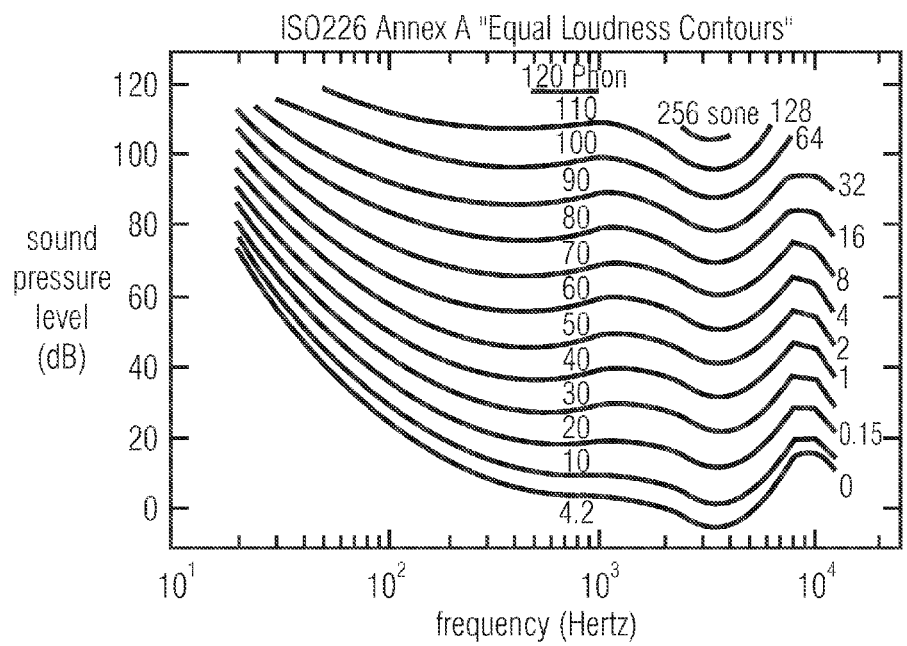
FIG. 2 is a schematic illustration of equal loudness contours.
Figure 3:
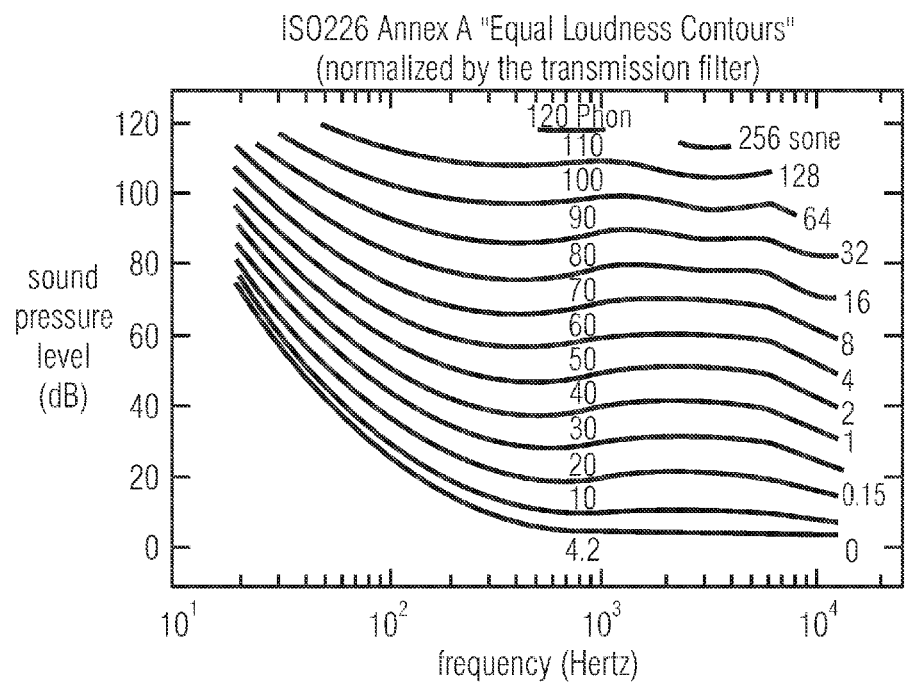
FIG. 3 is a schematic illustration of equal loudness contours normalized by transmission filters.

By using the described concept, for example, a varying attenuation of the sensation of the human hearing of low, middle and high frequencies caused by an increase or decrease of the sound intensity level of an audio signal may be easily compensated. For example, when decreasing the playback level from one level to another level, the perceived spectral balance of the audio signal changes. This is illustrated in FIG. 2 and FIG. 3, representing equal loudness contours. Especially in the low frequency region contours of different equal loudness are not parallel to each other. An amplification or attenuation of the low frequency bands different from the middle and/or high frequency bands may be equal to a bending of the equal loudness contours, so that they may be parallel or more parallel than before. In this way, the perceived spectral balance change can be compensated or nearly compensated by using the described concept.

The difference between the equal loudness contours of FIG. 2 and the equal loudness contours of FIG. 3 is a normalization by a transmission filter. This transmission filter may simulate a filtering effect of the transmission of audio through the outer and inner ear. Such a transmission filter may optionally be implemented in an apparatus shown in FIG. 1 for filtering the input audio signal before providing it to the excitation determiner 110.

For a more continuous modification of the input audio signal, the excitation determiner 110 may determine a value 112 of an excitation parameter for more than one subband of the plurality of subbands. Then, the storage device 120 may provide a spectral weighting factor 124 for each subband 102, a value 112 of an excitation parameter is determined for, and the signal modifier 130 may modify a content of each subband 102, a value 112 of an excitation parameter is determined for, based on the respective corresponding provided spectral weighting factor 124.

The plurality of subbands of the input audio signal may be provided by a memory unit or may be generated by an analysis filter bank.

An excitation parameter may be determined for one subband, for more than one subband or for all subbands of the plurality of subbands. For this, the apparatus 100 may comprise only one excitation determiner 110 determining one, more than one or all values of excitation parameters or may comprise an excitation determiner 110 for each subband 102, a value 112 of an excitation parameter is determined for. Further, the apparatus 100 may comprise one or more single modifier 130 for one or more subbands, an excitation parameter is determined for. However, it is sufficient using a single lookup table (and storage device) for all subbands 102, a value 112 of an excitation parameter is determined for.

The excitation determiner 110, the storage device 120 and the signal modifier may be independent hardware units, part of a computer, micro controller or digital signal processor as well as a computer program or a software product configured to run on a computer, micro controller or digital signal processor.

Figure 4:
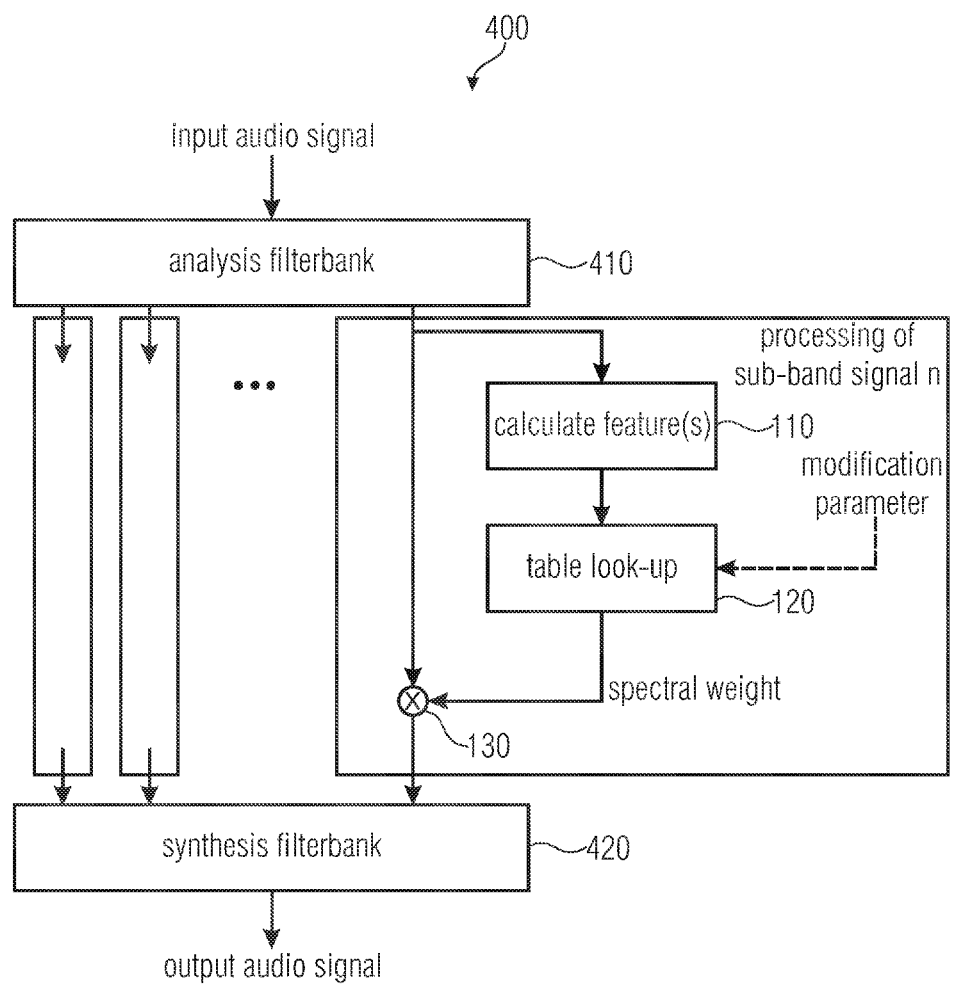
FIG. 4 is a block diagram of an apparatus for modifying an input audio signal.

FIG. 4 shows a block diagram of an apparatus 400 for modifying an input audio signal according to an embodiment of the invention. The apparatus 400 is similar to the apparatus shown in FIG. 1, but comprises additionally an analysis filter bank 410 and a synthesis filter bank 420. The analysis filter bank 410 separates the input audio signal into the plurality of subbands. Then the excitation determiner 110 determines a value of the excitation parameter (calculates a feature) for one or more subbands of the plurality of subbands. Afterwards the storage device 120 provides the corresponding one or more spectral weighting factors to one or more signal modifiers 130. Finally, the synthesis filter bank 420 combines the plurality of subbands containing at least one modified subband to obtain and provide a modified audio signal (or output audio signal).

The example shown in FIG. 4 may be an application of the proposed method for a generic case. The processing as shown for the n-th subband signal (n-th subband) may be applied to all other subband signals (or only to all subbands, a value of the excitation parameter is determined) in the same way.

Optionally, a spectral weighting factor contained by the lookup table is further associated to a predefined value of an external modification parameter, as indicated by the dashed line in FIG. 4 (but also applicable to the apparatus shown in FIG. 1). The external modification parameter (or simply modification parameter) may represent, for example, an input value of a user interface (e.g., volume and/or ambiance settings). Consequently, in this case, the storage device 120 may provide a spectral weighting factor corresponding to the value of the external modification parameter. For example, if a user increases or decreases the volume setting, the value of the external modification parameter changes and the storage device 120 may provide a corresponding other spectral weighting factor. Summarizing, the storage device 120 may provide a spectral weighting factor corresponding to the determined value of the excitation parameter of a subband, corresponding to the subband, the value of the excitation parameter is determined for, and corresponding to a value of the external modification parameter.

In this example, the lookup table may comprise exactly three dimensions associated to predefined values of the excitation parameter, associated to subbands of the plurality of subbands and associated to predefined values of the external modification parameter. This means, that each spectral weighting factor contained by the look up table is associated to a specific predefined value of the excitation parameter, to a subband of the plurality of subbands and to a specific predefined value of the external modification parameter. In other words, the lookup table contains for each combination of a predefined value of the excitation parameter, a subband and a predefined value of the external modification parameter one spectral weighting factor. The predefined values of the external modification parameter may be distributed, for example, linearly or logarithmically through a possible range of the external modification parameter.

Further, in some embodiments a spectral weighting factor contained by the lookup table is also associated to a predefined value of a background noise parameter. The background noise parameter may represent the level of background noise of the input audio signal. In this way, for example, a compensation of the effect of partial masking of an audio signal in presence of background noise may be realized. In this case, the storage device may provide a spectral weighting factor corresponding to a value of the background noise parameter. This may be done additionally or alternatively to the above-mentioned consideration of the external modification parameter. If both are considered, the storage device may provide the spectral weighting factor corresponding to the determined value of the excitation parameter of the subband, corresponding to the subband, the excitation parameter is determined for, corresponding to a value of the external modification parameter and corresponding to a value of the background noise parameter. In this case, the lookup table may comprise exactly four dimensions associated to predefined values of the excitation parameter, associated to subbands of the plurality of subbands, associated to predefined values of the external modification parameter and associated to predefined values of the background noise parameter. The predefined values of the background noise parameter may be distributed, for example, linearly or logarithmically through a possible range of the background noise parameter.

A value of the background noise parameter may be determined by a background noise detector. This may be done for the whole input audio signal before separation into subbands or on subband level for one subband, for more than one subband or for all subbands individually. Alternatively, if the plurality of subbands of the input audio signal is stored and provided by a memory unit, the value of the background noise parameter may also be provided by the memory unit.

In any case, the storage device does not comprise an input for a specific loudness parameter or a target specific loudness parameter, although the spectral weighting factors contained by the lookup table may be calculated based on a specific loudness parameter or a target specific loudness parameter. The calculation of the spectral weighting factors may be done externally and they may be stored by the storage device afterwards. Therefore, the computational complexity of an apparatus realized according to the described concept may be significantly reduced in comparison to known devices, since an explicit calculation of the spectral weighting factor is not necessary.

The spectral weighting factors may be calculated to be stored by the storage device, for example, in the following way.

The processing of the audio may be performed in the digital domain. Accordingly, the audio input signal may be denoted by the discrete time sequence x[n] which has been sampled from the audio source at some sampling frequency $f_s$. It can be assumed that the sequence x[n] has been appropriately scaled so that the rms power of x[n] in decibels given by $$RMS_{dB} = 10\log_{10}\left(\frac{1}{L}\sum_{n=0}^{L} x^2[n]\right)$$

is equal to the sound pressure level in dB at which the audio is being auditioned by a human listener. In addition, the audio signal may be assumed to be monophonic for simplicity of exposition.

The audio input signal is applied to an analysis filterbank or filterbank function ("Analysis Filterbank"). Each filter in Analysis Filterbank is designed to simulate the frequency response at a particular location along the basilar membrane in the inner ear. The Filterbank may include a set of linear filters whose bandwidth and spacing are constant on the Equivalent Rectangular Bandwidth (ERB) frequency scale, as defined by Moore, Glasberg and Baer ("B. C. J. Moore, B. Glasberg, T. Baer, "A Model for the Prediction of Thresholds, Loudness, and Partial Loudness," supra").

Although the ERB frequency scale more closely matches human perception and shows improved performance in producing objective loudness measurements that match subjective loudness results, the Bark frequency scale may be employed with reduced performance.

For a center frequency f in hertz, the width of one ERB band in hertz may be approximated as:

$$ERB(f)=24.7(4.37f/1000+1) \tag{1}$$

From this relation a warped frequency scale is defined such that at any point along the warped scale, the corresponding ERB in units of the warped scale is equal to one. The function for converting from linear frequency in hertz to this ERB frequency scale is obtained by integrating the reciprocal of Eqn. 1:

$$HzToERB(f) = \int \frac{1}{24.7\left(\frac{4.37f}{1000}+1\right)} df \tag{2a}$$

$$= 21.4\log_{10}\left(\frac{4.37f}{1000}+1\right)$$

It is also useful to express the transformation from the ERB scale back to the linear frequency scale by solving Eqn. 2a for f:

$$ERBToHz(e) = f = \frac{1000}{4.37}10^{(e/21.4-1)}, \tag{2b}$$

where e is in units of the ERB scale.

The Analysis Filterbank may include B auditory filters, referred to as subbands, at center frequencies $f_c[1] \ldots f_c[B]$ spaced uniformly along the ERB scale. More specifically, $$f_c[1]=f_{min} \tag{3a}$$

for $b=2\ldots B$ $$f_c[b]=f_c[b-1]+ERBToHz(HzToERB(f_c[b-1])+\Delta) \tag{3b}$$

$$f_c[B] \leq f_{max}, \tag{3c}$$

where $\Delta$ is the desired ERB spacing of the Analysis Filterbank, and where $f_{min}$ and $f_{max}$ are the desired minimum and maximum centre frequencies, respectively. One may choose $\Delta=1$, and taking into account the frequency range over which the human ear is sensitive, one may set $f_{min}=50$ Hz and $f_{max}=20{,}000$ Hz. With such parameters, for example, application of Eqns. 3a-c yields B=40 auditory filters.

The magnitude frequency response of each auditory filter may be characterized by a rounded exponential function, as suggested by Moore and Glasberg. Specifically, the magnitude response of a filter with centre frequency f[b] may be computed as:

$$H_b(f) = (1+pg)e^{-pg} \tag{4a}$$

where $$g = \left|\frac{f-f_c[b]}{f_c[b]}\right|, \tag{4b}$$

$$p = \frac{4f_c[b]}{ERB(f_c[b])} \tag{4c}$$

The filtering operations of Analysis Filterbank may be adequately approximated using a finite length Discrete Fourier Transform, commonly referred to as the Short-Time Discrete Fourier Transform (STDFT), because an implementation running the filters at the sampling rate of the audio signal, referred to as a full-rate implementation, is believed to provide more temporal resolution than is needed for accurate loudness measurements.

The STDFT of input audio signal x[n] may be defined as:

$$X[k,t] = \sum_{n=0}^{N-1} w[n]x[n+tT]e^{-j\frac{2\pi k}{N}}, \tag{5a}$$

where k is the frequency index, t is the time block index, N is the DFT size, T is the hop size, and w[n] is a length N window normalized so that $$\sum_{n=0}^{N-1} w^2[n] = 1 \tag{5b}$$

Note that the variable t in Eqn. 5a is a discrete index representing the time block of the STDFT as opposed to a measure of time in seconds. Each increment in t represents a hop of T samples along the signal x[n]. Subsequent references to the index t assume this definition. While different parameter settings and window shapes may be used depending upon the details of implementation, for $f_s$=44100 Hz, choosing N=2048, T=1024, and having w[n] to be a Hann window provides an adequate balance of time and frequency resolution. The STDFT described above may be implemented more efficient using the Fast Fourier Transform (FFT).

Instead of the STDFT, the Modified Discrete Cosine Transform (MDCT) may be utilized to implement the analysis filterbank. The MDCT is a transform commonly used in perceptual audio coders. The MDCT of the input audio signal x[n] may be given by:

$$X[k, t] = \sum_{n=0}^{N-1} w[n]x[n + tT]\cos((2\pi/N)(k + 1/2)(n + n_0)), \quad (6)$$

where $$n_0 = \frac{(N/2) + 1}{2}$$

Generally, the hopsize T is chosen to be exactly one-half the transform length N so that perfect reconstruction of the signal x[n] is possible.

The outputs of the Analysis Filterbank are applied to a transmission filter or transmission filter function ("Transmission Filter") which filters each band of the filterbank in accordance with the transmission of audio through the outer and middle ear.

In order to compute the loudness of the input audio signal, a measure of a audio signals' short-time energy in each filter of the Analysis Filterbank after application of the Transmission Filter a is needed. This time and frequency varying measure is referred to as the excitation. The short-time energy output of each filter in the Analysis Filterbank a may be approximated in an Excitation Function E[b,t] through multiplication of filter responses in the frequency domain with the power spectrum of the input signal:

$$E[b, t] = \frac{1}{N}\sum_{k=0}^{N-1} |H_b[k]|^2|P[k]|^2|X[k, t]|^2,$$

where b is the subband number, t is the block number, and $H_b[k]$ and P[k] are the frequency responses of the auditory filter and transmission filter, respectively, sampled at a frequency corresponding to STDFT or MDCT bin index k. It should be noted that forms for the magnitude response of the auditory filters other than that specified in Eqns. 4a-c may be used in Eqn. 7 to achieve similar results.

In summary, the output of the Excitation Function is a frequency domain representation of energy E in respective ERB bands b per time period t.

For certain applications, it may be desirable to smooth the excitation E[b,t] prior to its transformation to specific loudness. For example, smoothing may be performed recursively in a Smoothing function according to the equation:

$$\bar{E}[b,t]=\lambda_b\bar{E}[b,t]+(1-\lambda_b)E[b,t], \quad (8)$$

where the time constants $\lambda_b$ at each band b are selected in accordance with the desired application. In most cases the time constants may be advantageously chosen to be proportionate to the integration time of human loudness perception within band b. Watson and Gengel performed experiments demonstrating that this integration time is within the range of 150-175 ms at low frequencies (125-200 Hz) and 40-60 ms at high frequencies ("Charles S. Watson and Roy W. Gengel, "Signal Duration and Signal Frequency in Relation to Auditory Sensitivity" *Journal of the Acoustical Society of America*, Vol. 46, No. 4 (Part 2), 1969, pp. 989-997").

In a conversion function ("Specific Loudness"), each frequency band of the excitation may be converted into a component value of the specific loudness, which is measured in Sone per ERB.

Initially, in computing specific loudness, the excitation level in each band of $\bar{E}$[b,t] may be transformed to an equivalent excitation level at 1 kHz as specified by, for example, equal loudness contours normalized by a transmission filter:

$$\bar{E}_{1\,kHz}[b,t]=T_{1\,kHz}(\bar{E}[b,t],f_c[b]), \quad (9)$$

where $T_{1\,kHz}$(E,f) is a function that generates the level at 1 kHz, which is equally loud to level E at frequency f. Transformation to equivalent levels at 1 kHz simplifies the following specific loudness calculation.

Next, the specific loudness in each band may be computed as:

$$N[b,t]=\alpha[b,t]N_{NB}[b,t]+(1-\alpha[b,t])N_{WB}[b,t], \quad (10)$$

where $N_{NB}$[b,t] and $N_{WB}$[b,t] are specific loudness values based an a narrowband and wideband signal model, respectively. The value α[b,t] is an interpolation factor lying between 0 and 1 that is computed from the audio signal.

The narrowband and wideband specific loudness values $N_{NB}$[b,t] and $N_{WB}$[b,t] may be estimated from the transformed excitation using the exponential functions:

$$N_{NB}[b, t] = \begin{cases} G_{NB}\left(\left(\frac{\bar{E}_{1kHz}[b, t]}{TQ_{1kHz}}\right)^{\beta_{NB}} - 1\right), & \bar{E}_{1kHz}[b, t] > TQ_{1kHz} \\ 0, & \text{otherwise} \end{cases} \quad (11a, 11b)$$

$$N_{WB}[m, t] = \begin{cases} G_{WB}\left(\left(\frac{\bar{E}_{1kHz}[b, t]}{TQ_{1kHz}}\right)^{\beta_{WB}} - 1\right), & \bar{E}_{1kHz}[b, t] > TQ_{1kHz} \\ 0, & \text{otherwise,} \end{cases}$$

where $TQ_{1\,kHz}$ is the excitation level at threshold in quiet for a 1 kHz tone. From the equal loudness contours $TQ_{1\,kHz}$ equals 4.2 dB. One notes that both of these specific loudness functions are equal to zero when the excitation is equal to the threshold in quiet. For excitations greater than the threshold in quiet, both functions grow monotonically with a power law in accordance with Stevens' law of intensity sensation. The exponent for the narrowband function is chosen to be larger than that of the wideband function, making the narrowband function increase more rapidly than the wideband function. The specific selection of exponents B and gains G for the narrowband and wideband cases and are chosen to match experimental data on the growth of loudness for tones and noise.

The specific loudness may be equal to some small value instead of zero when the excitation is at the threshold of hearing. Specific loudness should then decrease monotonically to zero as the excitation decreases to zero. The justification is that the threshold of hearing is a probabilistic threshold (the point at which a tone is detected 50% of the time), and that a number of tones, each at threshold, presented together may sum to a sound that is more audible than any of the individual tones. If the specific loudness is defined to be zero when the excitation is at or below threshold, then a unique solution for the gain solver does not exist for excitations at or below threshold. If, on the other hand, specific loudness is defined to be monotonically increasing for all values of excitation greater than or equal to zero, then a unique solution does exist. Loudness scaling greater than unity will result in a gain greater than unity and vice versa. The specific loudness functions in Eqns. 11a and 11b may be altered to have the desired property according to:

$$N_{NB}[b,t] = \begin{cases} G_{NB}\left(\left(\frac{\overline{E}_{1kHz}[b,t]}{TQ_{1kHz}}\right)^{\beta_{NB}} - 1\right), & \overline{E}_{1kHz}[b,t] > \lambda TQ_{1kHz} \\ \exp\left\{K_{NB}\left(-\log\left(\frac{\overline{E}_{1kHz}[b,t]}{TQ_{1kHz}}\right) + C_{NB}\right)^{\eta_{NB}}\right\}, & \text{otherwise,} \end{cases}$$ (11c, 11d)

$$N_{WB}[m,t] = \begin{cases} G_{WB}\left(\left(\frac{\overline{E}_{1kHz}[b,t]}{TQ_{1kHz}}\right)^{\beta_{WB}} - 1\right), & \overline{E}_{1kHz}[b,t] > \lambda TQ_{1kHz} \\ \exp\left\{K_{WB}\left(-\log\left(\frac{\overline{E}_{1kHz}[b,t]}{TQ_{1kHz}}\right) + C_{WB}\right)^{\eta_{WB}}\right\}, & \text{otherwise} \end{cases}$$

where the constant $\lambda$, is greater than one, the exponent $\eta$ is less than one, and the constants K and C are chosen so that the specific loudness function and its first derivative are continuous at the point:

$$\overline{E}_{1kHz}[b,t] = \lambda TQ_{1kHz}$$

From the specific loudness, the overall or "total" loudness L[t] is given by the sum of the specific loudness across all bands b:

$$L[t] = \sum_b N[b,t]$$ (12)

In a specific loudness modification function ("Specific Loudness Modification"), the target specific loudness, referred to as, $\hat{N}[b,t]$ may be calculated from the specific loudness in various ways. As is described in greater detail below, a target specific loudness may be calculated using a scale factor $\alpha$, for example, in the case of a volume control. See Eqn. 16 below and its associated description. In the case of automatic gain control (AGC) and dynamic range control (DRC), a target specific loudness may be calculated using a ratio of desired output loudness to input loudness. See Eqns. 17 and 18 below and their associated descriptions. In the case of dynamic equalization, a target specific loudness may be calculated using a relationship set forth in Eqn. 23 and its associated description.

In this example, for each band b and every time interval t, a gain solving function takes as its inputs the smoothed excitation $\overline{E}[b,t]$ and the target specific loudness $\hat{N}[b,t]$ and generates spectral weighting factors, also called gains G[b,t], used subsequently for modifying the audio. Letting the function $\psi\{\cdot\}$ represent the non-linear transformation from excitation to specific loudness such that $$N[b,t] = \Psi\{\overline{E}[b,t]\},$$ (13)

the Gain Solver finds G[b,t] such that $$\hat{N}[b,t] = \Psi\{G^2[b,t]\overline{E}[b,t]\}.$$ (14a)

The gain solving function determine frequency- and time-varying gains (spectral weighting factors), which, when applied to the original excitation, result in a specific loudness that, ideally, is equal to the desired target specific loudness. In practice, the gain solving function determine frequency- and time-varying gains, which when applied to the frequency-domain version of the audio signal results in modifying the audio signal in order to reduce the difference between its specific loudness and the target specific loudness. Ideally, the modification is such that the modified audio signal has a specific loudness that is an approximation of a dose of the target specific loudness. The solution to Eqn. 14a may be implemented in a variety of ways. For example, if a closed form mathematical expression for the inverse of the specific loudness, represented by $\psi^{-1}\{\cdot\}$, exists, then the gains may be computed directly by re-arranging equation 14a:

$$G[b,t] = \sqrt{\frac{\Psi^{-1}(\hat{N}[b,t])}{\overline{E}[b,t]}}$$ (14b)

Alternatively, if a closed form solution for $\psi^{-1}\{\cdot\}$ does not exist, an iterative approach may be employed in which for each iteration equation 14a is evaluated using a current estimate of the gains. The resulting specific loudness is compared with the desired target and the gains are updated based on the error. If the gains are updated properly, they will converge to the desired solution. As mentioned earlier, the target specific loudness may be represented by a scaling of the specific loudness:

$$\hat{N}[b,t] = \Xi[b,t]N[b,t]$$ (14c)

Substituting equation 13 into 14c and then 14c into 14b yields an alternative expression for the gains:

$$G[b,t] = \sqrt{\frac{\Psi^{-1}(\Xi[b,t]\Psi(\overline{E}[b,t]))}{\overline{E}[b,t]}}$$ (14d)

The calculated spectral weighting factors or gains are stored in the lookup table of the storage device.

In some embodiments according to the invention, the excitation determiner does not determine a value of an excitation parameter for all subbands of the plurality of subbands. In this case, it is sufficient that the lookup table contains only spectral weighting factors associated to subbands, a value of an excitation parameter is determined for. In this way, the storage space of the storage device needed for storing the lookup table can be significantly reduced.

Since the bending of the equal loudness contours, which should be compensated, is stronger for lower frequencies (see FIGS. 2 and 3), it may be sufficient to compensate a loudness variation only for the low frequency subbands. Therefore, it may be useful to calculate excitation parameters and store spectral weighting factors for low frequency subbands. In contrast, for high frequency subbands no value of an excitation parameter may be determined and no spectral weighting factor associated to high frequency subbands may be stored. In other words, a subband, a value of an excitation parameter is determined for, may comprise lower frequencies than a subband, no value of an excitation parameter is determined for.

Further, it may not be needed to modify the high frequency subbands. In other words, a content of a subband may not be modified by the signal modifier, if the excitation determiner does not determine a value of an excitation parameter for this subband. This may only be the case, if no other parameter, as, for example, an external modification parameter or background noise parameter, is considered.

Alternatively, a spectral weighting factor provided by the storage device may be used by the signal modifier for more than one subband. In other words, the signal modifier may modify a content of a subband, no value of an excitation parameter is determined for, based on a spectral weighting factor provided for a subband, a value of an excitation parameter is determined for. Considering the behavior of the equal loudness contours shown in FIGS. 2 and 3, it may be sufficient to modify high frequency bands according to the same spectral weighting factor. This spectral weighting factor may be the spectral weighting factor provided for the subband comprising the highest frequencies of all subbands, a value of an excitation parameter is determined for. More generally, the signal modifier may modify a content of a subband, no value of an excitation parameter is determined for, based on the spectral weighting factor provided for a subband containing higher frequencies than all other subbands, a value of an excitation parameter is determined for. For example, it may be sufficient, that the excitation determiner determines the value of an excitation parameter only for 5 to 15 (or 2 to 20, 7 to 12 or only 5, 6, 7, 8, 9, 10, 11, 12) subbands of the plurality of subbands or only for less than a quarter, one third, a half or two thirds of the subbands of the plurality of subbands. These subbands may comprise lower frequencies than all other subbands of the plurality of subbands. Further, the signal modifier may modify contents of these subbands according to spectral weighting factors provided by the storage device for these subbands.

For example, the Bark scale comprises 25 frequency bands and it may be sufficient to modify the lowest 7 frequency bands, since the slowest frequency bands show the strongest deviation from the idle behavior. Alternately, the lowest bands of the ERB scale may be modified. The remaining subbands of the plurality of subbands may stay unmodified, may be modified according to an external modification parameter and/or a background noise parameter or may be modified according to the spectral weighting factor provided for a subband, a value of an excitation parameter is determined for, containing higher frequencies than all other subbands, a value of an excitation parameter is determined for.

Figure 5:
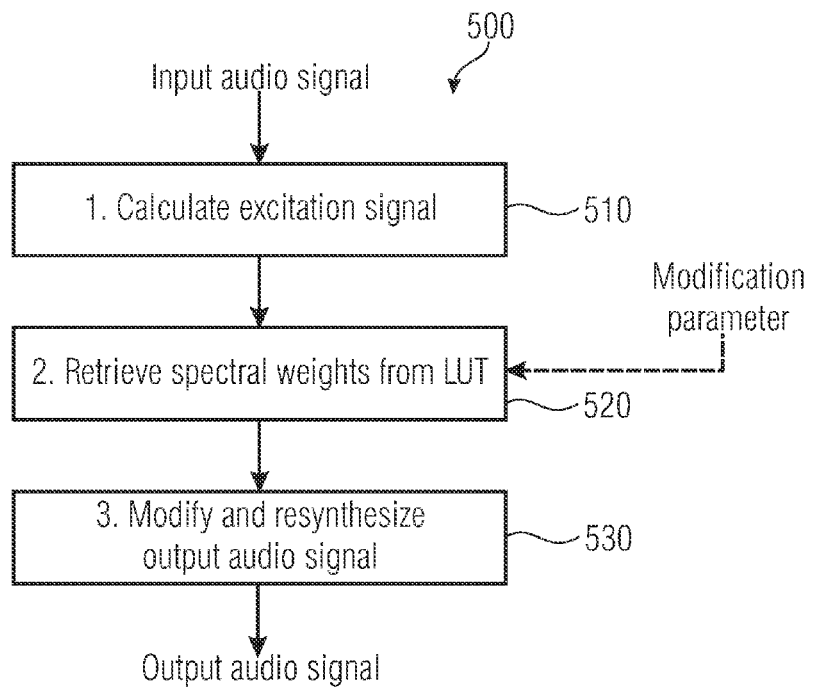
FIG. 5 is a flow chart of a method for modifying an input audio signal.

FIG. 5 shows a flow chart of a method 500 for modifying an input audio signal according to an embodiment of the invention. The method 500 comprises determining 510 a value of an excitation parameter of a subband of a plurality of subbands of the input audio signal based on an energy content of the subband. Further, the method 500 comprises providing 520 a spectral weighting factor corresponding to the determined value of the excitation parameter and corresponding to the subband, the value of the excitation parameter is determined for. The spectral weighting factor is stored in a lookup table containing a plurality of spectral weighting factors. A spectral weighting factor of the plurality of spectral weighting factors is associated to a predefined value of the excitation parameter and a subband of the plurality of subbands. Finally, the method 500 comprises modifying the subband, the value of the excitation parameter is determined for, based on the provided spectral weighting factor to obtain and provide a modified subband.

In other words, the method 500 comprises a calculation 510 of an excitation signal, retrieving 520 spectral weights (spectral weighting factors) from the lookup table and modifying 530 the output audio signal. Optionally, the method 500 comprises a re-synthesis of the output audio signal (combining the subbands to obtain a modified audio signal).

This may, for example, be a method for efficient and generic signal modification.

Further optionally, an external modification parameter may also be taken into account (indicated by the dashed line) as described above.

Figure 6:
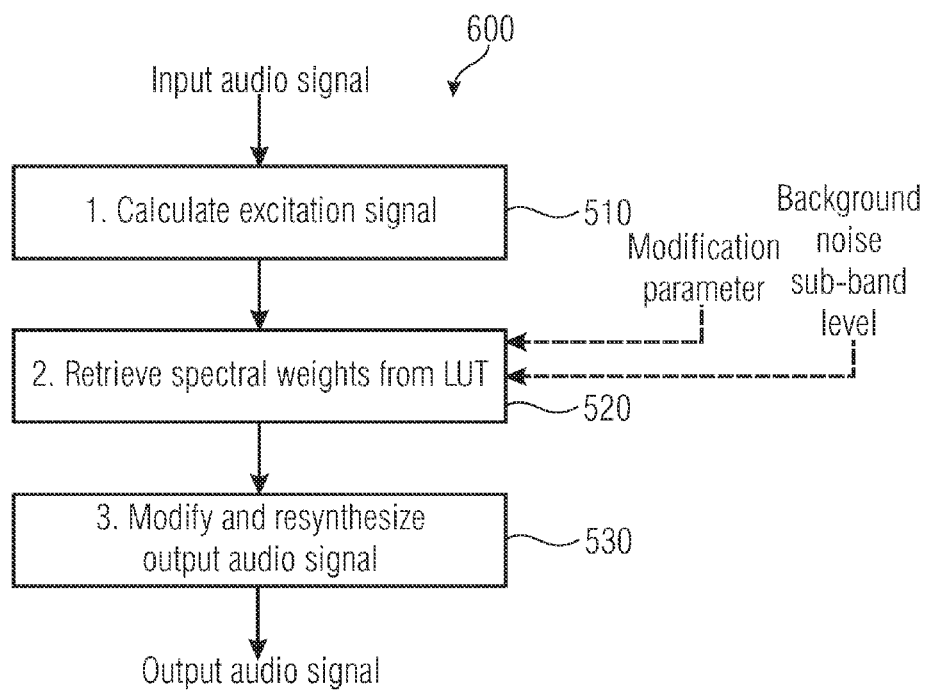
FIG. 6 is a flow chart of a method for modifying an input audio signal.
Figure 7:
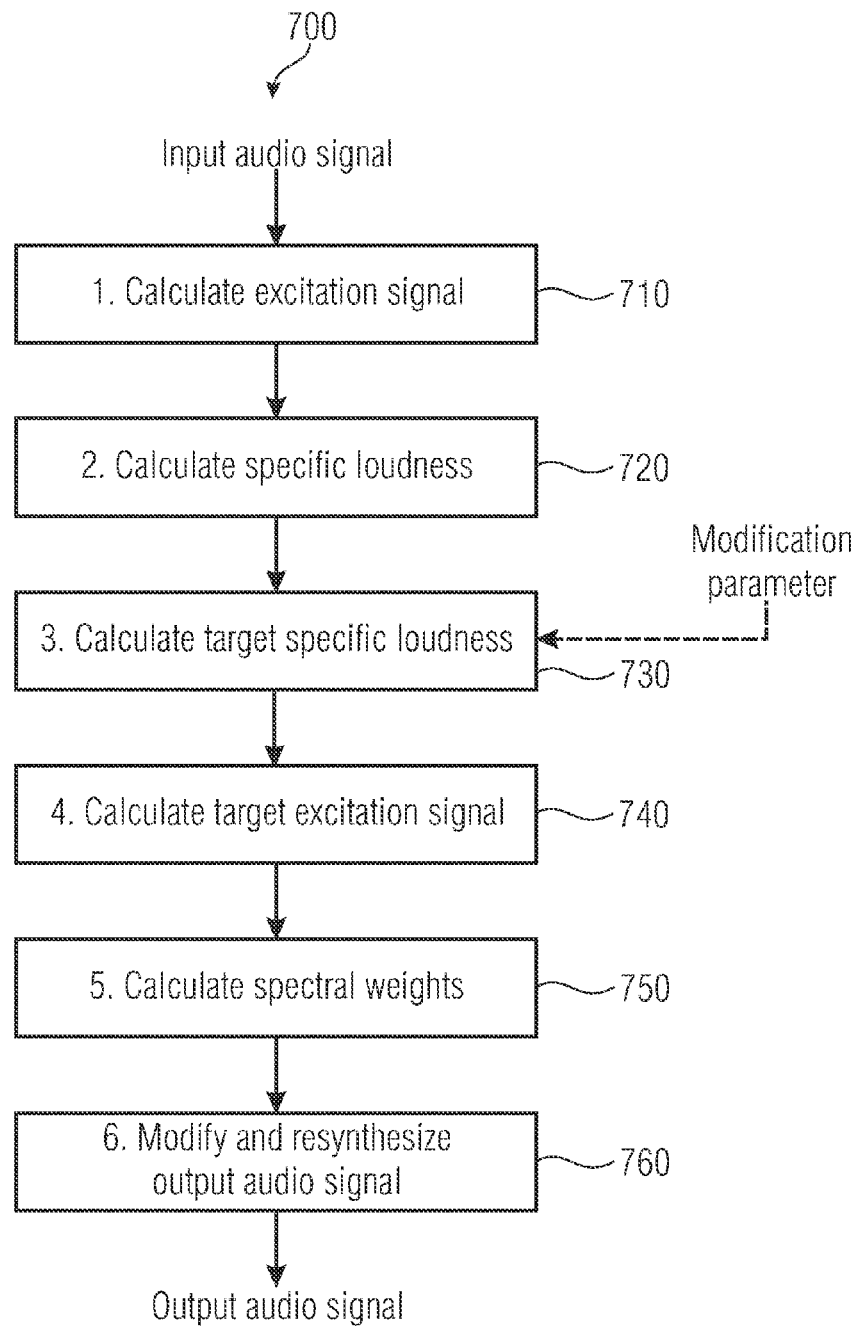
FIG. 7 is a flow chart of a known method for modifying an input audio signal.

An additional consideration of a background noise subband level (a background noise parameter) is mentioned by the method 600 shown in FIG. 6.

Some embodiments according to the invention relate to an efficient realization of perceptual processing of audio signals. The described concept relates to a flexible and highly efficient architecture for frequency selective audio signal modification and processing, that can easily incorporate the characteristics of psychoacoustic effects into its processing without suffering from the computational load of explicit auditory modeling. As an example, the realization of a multi-band processor for perceptual loudness control is considered, which is based on the shown architecture.

This may be an efficient realization of the psychoacoustic loudness control.

The processing described above is comparable with a filtering of the input signal with a filter characteristic which is controlled by the input level within each auditory frequency band. It can be implemented more efficiently.

Basically, the proposed method bypasses the calculation of the specific loudness and the corresponding backward calculation, and thereby avoids the computational intense processing steps at the cost of slightly increased memory requirements.

The efficient implementation can be implemented using a simple look-up table (LUT), possibly with interpolation.

The LUT is computed by measuring the input values and output values process implemented as described above. The LUT has, for example, 3 dimensions. It outputs a modified subband or a modified audio signal given the input excitation, the modification parameter and the frequency band index.

For example, it can be efficiently implemented by recognizing that its functionality is dependent on the frequency band index only for the lowest frequency bands, e.g., when using an auditory filter bank with a resolution corresponding to the Bark scale, the filter bank may have 25 band-pass filters. Storing the transfer function in the LUT for the lowest 7 bands only may be sufficient, since for higher band indices the same input-output relation holds as for band index 7.

This efficient processing yields a volume control which is correct in a psychoacoustic sense. Other applications, namely dynamic range control and/or dynamic equalization, are derived with the efficient processing as described above as by appropriate indexing of the LUT.

Finally, background noise compensation (i.e., the compensation of the effect of partial masking of an audio signal in the presence of background noise) can be achieved by adding a fourth dimension to the LUT representing the level of the background noise. The block diagram of the proposed processing for noise compensation is illustrated in FIG. 6.

While the processing described so far aimed at the emulation of a psychoacoustic loudness scaling algorithm, the architecture described in FIG. 1 or FIG. 4 can produce a much richer spectrum of sound modifications than would be available with a psychoacoustic loudness scaling algorithm since its LUT. It can be made dependent on even more factors (e.g., a user preference setting, other time-variant factors etc). It can be freely "tuned" according to the subjective listener preference beyond the characteristics that are provided by a function given as a closed-form expression.

In summary, the invention relates to a flexible and highly efficient architecture for frequency selective audio signal modification and processing, that can easily incorporate the characteristics of psychoacoustic effects into its processing without suffering from the computational load of explicit auditory modeling.

On an abstract level, the proposed efficient processing comprises the following steps. Based on the input signal, one or more feature values (including the value of the excitation parameter) may be calculated for a number of frequency bands (e.g., critical bands). Based on these feature values (and, possibly, other information), a table look-up is performed for each of these frequency bands to determine one or several table output parameters (spectral weighting factors) for each frequency band. These table output parameters are then used to determine the modification (e.g., multiplicative scaling) of the input signal in the corresponding frequency bands.

The processing of audio signals in frequency bands usually implies using filter-banks, i.e., the input signal is split into several frequency bands (sub-bands) by an analysis filter-bank, and the final output signal is obtained by feeding the modified sub-band signals into the synthesis filter-bank. Analysis and synthesis filter-bank combine to reconstruct the input time signal either perfectly or near perfectly.

A typical number of frequency bands is between 4 and 40. The table look-up based on feature values usually involves quantization of the feature values into a limited set of values which can be used as a look-up index into the table. Furthermore, the look-up table size can be reduced by choosing a rather coarse quantization step size and subsequently interpolating between the (two or more) adjacent table output parameter values. In order to consider several input features for the computation of parameter output values, a look-up table with several dimensions can be used, e.g., modification factor LUT containing excitation idx (index), tonality idx, frequency idx. In a very simple (and efficient) case, the output parameter values directly represent multiplication factors to be applied to the input sub-band in order to determine the output sub-band signals. This is shown, for example, in FIG. 4.

Although some aspects of the described concept have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a Blue-Ray, a CD, a ROM, a PROM, an EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are advantageously performed by any hardware apparatus.

The above described embodiments are merely illustrative for the principles of the present invention. It is understood that modifications and variations of the arrangements and the details described herein will be apparent to others skilled in the art. It is the intent, therefore, to be limited only by the scope of the impending patent claims and not by the specific details presented by way of description and explanation of the embodiments herein.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. Apparatus for modifying an input audio signal, comprising:
an excitation determiner configured to determine a value of an excitation parameter of a subband of a plurality of subbands of the input audio signal based on an energy content of the subband, wherein the value of the excitation parameter indicates a power of the audio signal in the subband or a short time energy of the audio signal in the subband or a quantized value of the short time energy of the audio signal in the subband;
a storage device storing a lookup table comprising a plurality of spectral weighting factors, wherein a spectral weighting factor of the plurality of spectral weighting factors is associated to a predefined value of the excitation parameter and a subband of the plurality of subbands, wherein the storage device is configured to provide a spectral weighting factor corresponding to the determined value of the excitation parameter and corresponding to the subband, the value of the excitation parameter is determined for; and
a signal modifier configured to modify a content of the subband of the input audio signal, the value of the excitation parameter is determined for, based on the provided spectral weighting factor to provide a modified subband by multiplicative scaling of the subband of the audio signal by the spectral weighting factor provided by the lookup table.

2. Apparatus according to claim 1, wherein the excitation determiner is configured to determine a value of an excitation parameter for more than one subband of the plurality of subbands, wherein the storage device is configured to provide a spectral weighting factor for each subband, a value of the excitation parameter is determined for, and wherein the signal modifier is configured to modify a content of each subband, a value of the excitation parameter is determined for, based on the respective corresponding provided spectral weighting factor.

3. Apparatus according to claim 1, further comprising:
an analysis filter bank configured to separate the input audio signal into the plurality of subbands; and
a synthesis filter bank configured to combine the plurality of subbands comprising at least one modified subband to provide a modified audio signal.

4. Apparatus according to claim 1, wherein each spectral weighting factor comprised by the lookup table is associated to a predefined value of the excitation parameter and a subband of the plurality of subbands.

5. Apparatus according to claim 1, wherein the subbands of the plurality of subbands of the input audio signal are divided up according to the ERB scale, the Bark scale or another frequency spacing which imitates the frequency resolution of the human ear.

6. Apparatus according to claim 1, wherein the excitation determiner is configured to determine a value of an excitation parameter not for all subbands of the plurality of subbands, and wherein the lookup table comprises only spectral weighting factors associated to subbands, a value of an excitation parameter is determined for.

7. Apparatus according to claim 6, wherein a subband, a value of an excitation parameter is determined for, comprises lower frequencies than a subband, no value of an excitation parameter is determined for.

8. Apparatus according to claim 6, wherein a content of a subband of the input audio signal is not modified by the signal modifier, if the excitation determiner does not determine a value of an excitation parameter for this subband.

9. Apparatus according to claim 1, wherein the excitation determiner is configured to determine a value of an excitation parameter only for less than one third of the subbands of the plurality of subbands, and wherein the signal modifier is configured to modify a content of the subbands, a value of an excitation parameter is determined for, based on a respective corresponding provided spectral weighting factor, wherein these subbands comprise lower frequencies than all other subbands of the plurality of subbands, a value of an excitation parameter is determined for.

10. Apparatus according to claim 1, wherein the signal modifier is configured to modify a content of a subband, no value of an excitation parameter is determined for, based on a spectral weighting factor provided for a subband, a value of an excitation parameter is determined for.

11. Apparatus according to claim 10, wherein the signal modifier modifies a content of the subband, no value of an excitation parameter is determined for, based on a spectral weighting factor provided for a subband, a value of an excitation parameter is determined for, comprising higher frequencies than all other subbands, a value of an excitation parameter is determined for.

12. Apparatus according to claim 1, wherein a spectral weighting factor comprised by the lookup table is further associated to a predefined value of an external modification parameter, wherein the storage device is configured to provide a spectral weighting factor corresponding to the determined value of the excitation parameter of a subband, corresponding to the subband, the value of the excitation parameter is determined for, and corresponding to a value of the external modification parameter.

13. Apparatus according to claim 12, wherein the lookup table comprises exactly three-dimensions associated to predefined values of the excitation parameter, to subbands of the plurality of subbands and to predefined values of the external modification parameter.

14. Apparatus according to claim 12, wherein the signal modifier is configured to modify a content of a subband, no value of an excitation parameter is determined for, based on a value of the external modification parameter.

15. Apparatus according to claim 1, wherein a spectral weighting factor comprised by the lookup table is further associated to a predefined value of a background noise parameter, wherein the storage device is configured to provide a spectral weighting factor corresponding to the determined value of the excitation parameter of the subband, corresponding to the subband, the value of the excitation parameter is determined for, and corresponding to a value of the background noise parameter.

16. Apparatus according to claim 15, wherein the lookup table comprises exactly four-dimensions associated to predefined values of the excitation parameter, to subbands of the plurality of subbands, to predefined values of the external modification parameter and to predefined values of the background noise parameter.

17. Apparatus according to claim 1, wherein the storage device comprises no input for a specific loudness parameter or a target specific loudness parameter.

18. Apparatus according to claim 1, wherein the lookup table stored by the storage device is the only lookup table of the apparatus for modifying the input audio signal.

19. Apparatus according to claim 1, wherein the excitation determiner configured to measure an energy content of the subband and configured to quantize the measured energy content of the subband to acquire the value of the excitation parameter, so that the value of the excitation parameter is equal to a predefined value of the excitation parameter.

20. Method for modifying an input audio signal, comprising:
- determining a value of an excitation parameter of a subband of a plurality of subbands of the input audio signal based on an energy content of the subband, wherein the value of the excitation parameter indicates a power of the audio signal in the subband or a short time energy of the audio signal in the subband or a quantized value of the short time energy of the audio signal in the subband;
- providing a spectral weighting factor corresponding to the determined value of the excitation parameter and corresponding to the subband, the value of the excitation parameter is determined for, wherein the spectral weighting factor is stored in a lookup table comprising a plurality of spectral weighting factors, wherein a spectral weighting factor of the plurality of spectral weighting factors is associated to a predefined value of the excitation parameter and a subband of the plurality of subbands;
- modifying the subband, the value of the excitation parameter is determined for, based on the provided spectral weighting factor to provide a modified subband by multiplicative scaling of the subband of the audio signal by the spectral weighting factor provided by the lookup table.

21. A non-transitory computer readable medium including a computer program with a program code for performing, when the computer program runs on a computer or a microcontroller, the method for modifying an input audio signal, comprising:
- determining a value of an excitation parameter of a subband of a plurality of subbands of the input audio signal based on an energy content of the subband, wherein the value of the excitation parameter indicates a power of the audio signal in the subband or a short time energy of the audio signal in the subband or a quantized value of the short time energy of the audio signal in the subband;
- providing a spectral weighting factor corresponding to the determined value of the excitation parameter and corresponding to the subband, the value of the excitation parameter is determined for, wherein the spectral weighting factor is stored in a lookup table comprising a plurality of spectral weighting factors, wherein a spectral weighting factor of the plurality of spectral weighting factors is associated to a predefined value of the excitation parameter and a subband of the plurality of subbands;
- modifying the subband, the value of the excitation parameter is determined for, based on the provided spectral weighting factor to provide a modified subband by multiplicative scaling of the subband of the audio signal by the spectral weighting factor provided by the lookup table.

* * * * *